(12) United States Patent
Yuzue

(10) Patent No.: US 6,323,713 B1
(45) Date of Patent: Nov. 27, 2001

(54) CLOCK SIGNAL GENERATING CIRCUIT AND CLOCK FREQUENCY ADJUSTING METHOD THEREFOR

(75) Inventor: Masashi Yuzue, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/534,632

(22) Filed: Mar. 27, 2000

(30) Foreign Application Priority Data

May 31, 1999 (JP) .................................................. 11-151301

(51) Int. Cl.⁷ ....................................................... G06F 1/04
(52) U.S. Cl. ............................ 327/291; 327/116; 327/119
(58) Field of Search .............................. 327/116, 119–122, 327/159, 160, 291, 356–359; 331/1 A, 57

(56) References Cited

U.S. PATENT DOCUMENTS

| 3,798,564 | * | 3/1974 | Langham | ............................. | 327/116 |
| 3,970,954 | * | 7/1976 | Even | ..................................... | 327/116 |

FOREIGN PATENT DOCUMENTS

| 03085012 | 4/1991 | (JP) . |
| 04100310 | 4/1992 | (JP) . |
| 05129895 | 5/1993 | (JP) . |

\* cited by examiner

Primary Examiner—Kenneth B. Wells
(74) Attorney, Agent, or Firm—Rabin & Berdo, P.C.

(57) ABSTRACT

A clock signal generating circuit and its clock frequency adjusting method, in which a clock signal of a desired frequency can be generated even if an oscillating circuit of relatively low frequency precision is used. Each of frequency division data is sequentially dnd repetitively read out from a memory in which a plurality of frequency division data has been stored, and a signal whose logic level is inverted each time the read-out frequency division data and the number of pulses of a constant frequency signal generated by an oscillating circuit coincide is generated as a clock signal. An adjustment is performed so as to decrease a value of at least one of the frequency division data stored in the memory when the frequency of the constant frequency signal is lower than the desired request frequency and to increase the value of at least one of the frequency division data stored in the memory when the frequency of the constant frequency signal is higher than the desired request frequency.

8 Claims, 9 Drawing Sheets

| ADDRESS | FREQUENCY DIVISION DATA |
|---|---|
| 0 | 2 |
| 1 | 2 |
| 2 | 2 |
| 3 | 2 |

FIG. 6

| ADDRESS | FREQUENCY DIVISION DATA |
|---|---|
| 0 | 2 |
| 1 | 2 |
| 2 | 2 |
| 3 | 3 |

WHEN THE FREQUENCY IS HIGHER THAN REQUEST FREQUENCY fp

FIG. 5

| ADDRESS | FREQUENCY DIVISION DATA |
|---|---|
| 0 | 2 |
| 1 | 2 |
| 2 | 2 |
| 3 | 1 |

WHEN THE FREQUENCY IS LOWER THAN REQUEST FREQUENCY fp

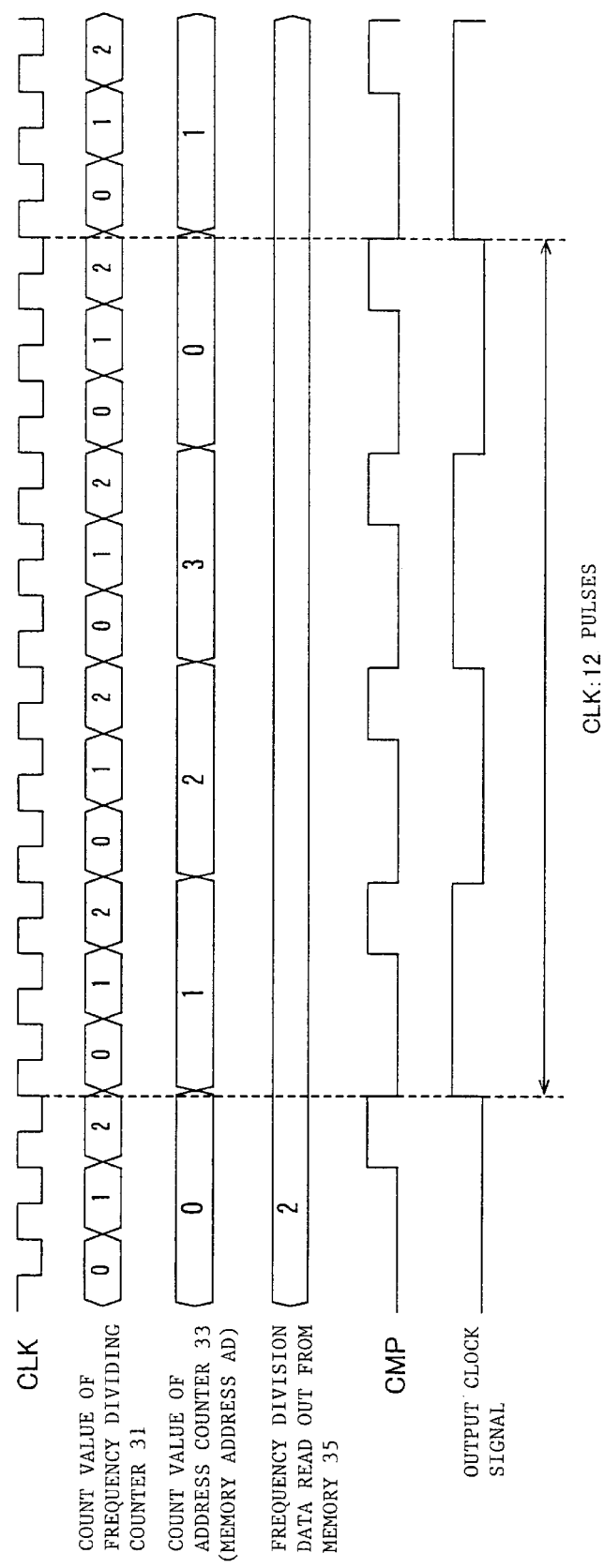

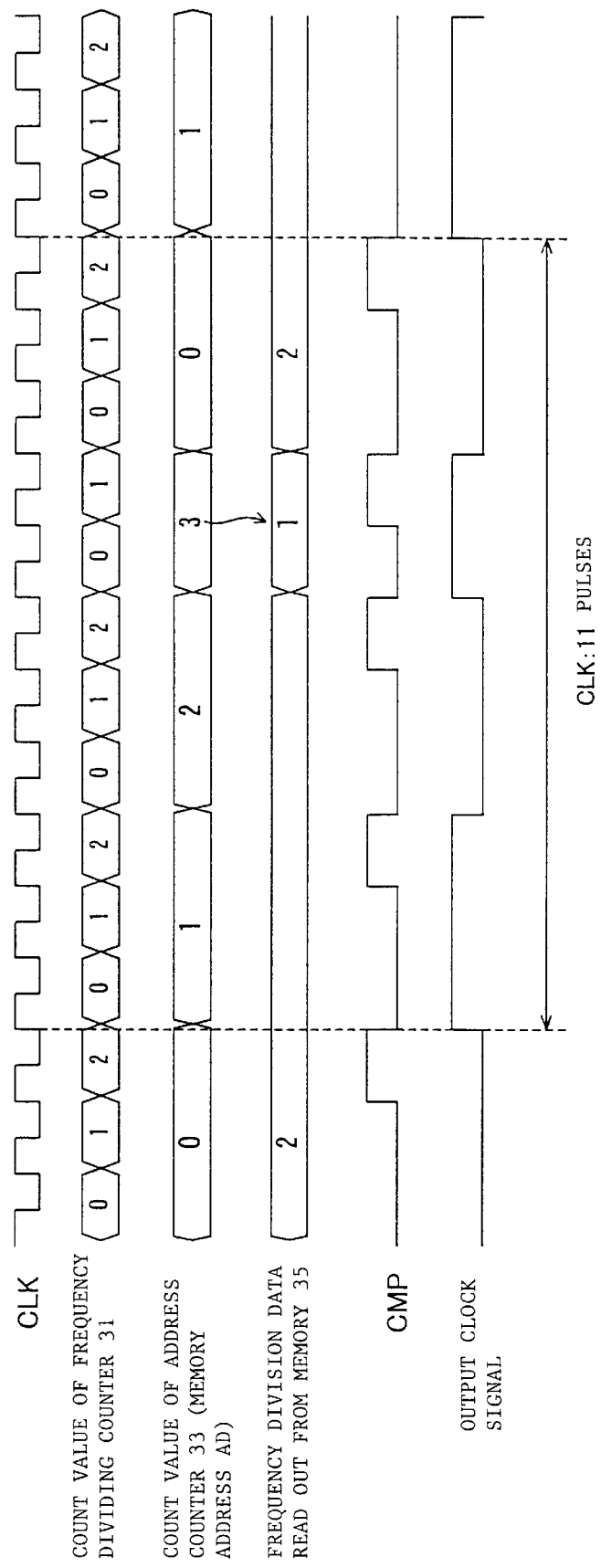

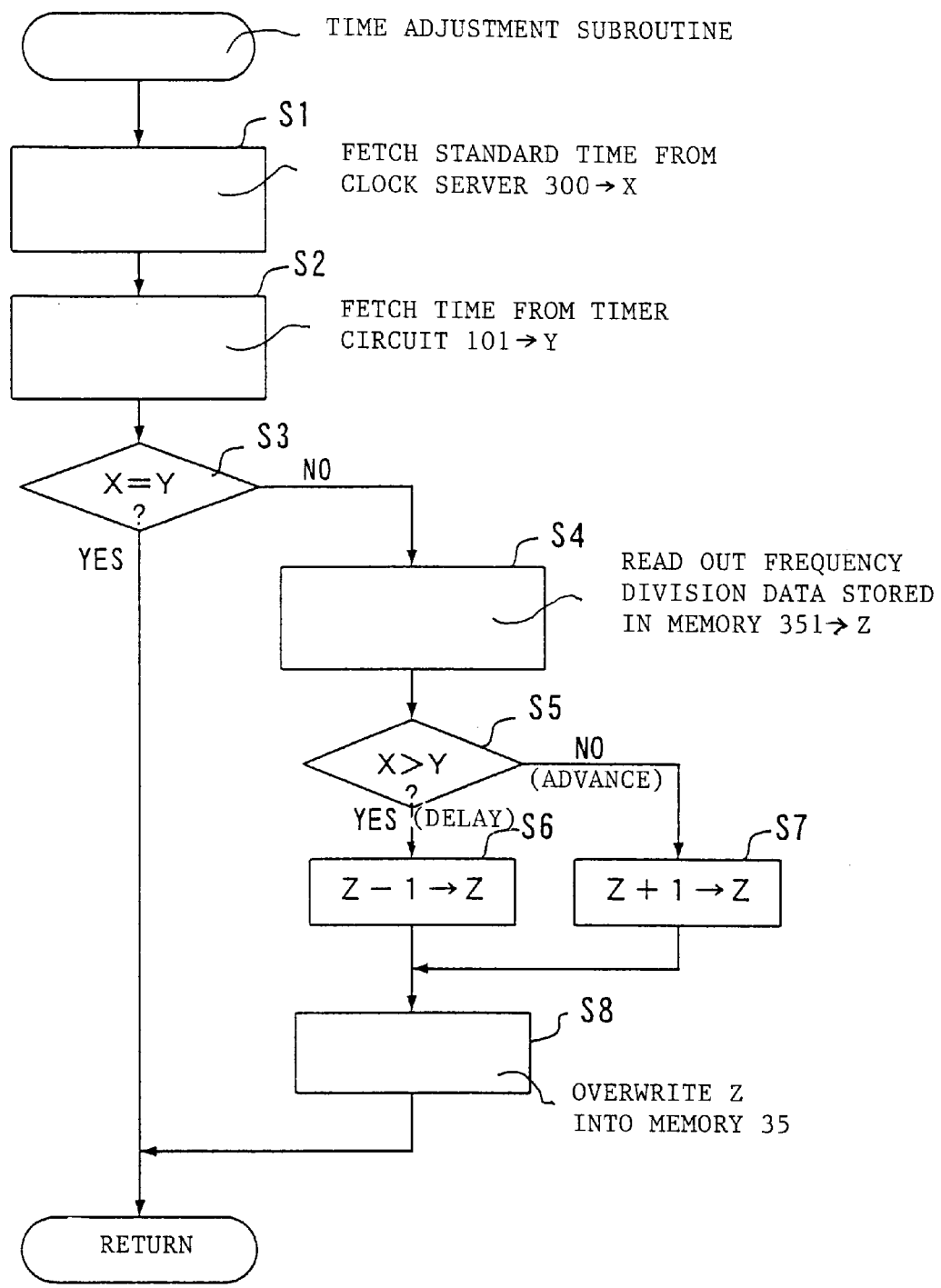

CLOCK SIGNAL GENERATING CIRCUIT AND CLOCK FREQUENCY ADJUSTING METHOD THEREFOR

BACKGROUND OF THE INVENTION

1. Field of the Invention

The invention relates to a clock signal generating circuit for generating a clock signal.

2. Description of Related Art

In an apparatus such as communication equipment which needs a clock signal of high frequency precision, a device of high frequency precision is used as an oscillating circuit (for example, quartz oscillator) serving as a source to generate the clock signal.

Since the oscillating circuit of high frequency precision, however, is expensive, it has a problem that a product price also rises in accordance with it.

OBJECTS AND SUMMARY OF THE INVENTION

The invention has been made to solve the problem and it is an object of the invention to provide a clock signal generating circuit, which can generate a clock signal of a desired frequency even if an oscillating circuit of relatively low frequency precision is used, and to provide its clock frequency adjusting method.

According to the invention, there is provided a clock signal generating circuit for generating a clock signal of a frequency obtained by dividing a frequency of a constant frequency signal comprising: a memory in which a plurality of frequency division data has been stored; a memory control circuit for providing control so as to sequentially and repetitively read out each of the frequency division data stored in the memory; a frequency dividing counter for obtaining a count value by counting the number of pulses of the constant frequency signal and resetting the count value to an initial value when the count value coincides with the frequency division data read out from the memory; and a circuit for forming a signal whose logic level is inverted each time the frequency division data read out from the memory and the count value coincide, and generating it as a clock signal.

According to a clock frequency adjusting method of the invention, when the frequency of the constant frequency signal is lower than a desired request frequency, a value of at least one of the frequency division data stored in the memory is decreased, and when the frequency of the constant frequency signal is higher than the desired request frequency, a value of at least one of the frequency division data stored in the memory is increased.

According to the invention, each of the frequency division data is sequentially and repetitively read out from the memory in which the plurality of frequency division data has been stored and the signal whose logic level is inverted each time the read-out frequency division data coincides with the number of pulses of the constant frequency signal generated by an oscillating circuit is generated as a clock signal. By performing an adjustment, therefore, so as to decrease the value of at least one of the frequency division data stored in the memory when the frequency of the constant frequency signal is lower than the desired request frequency and to increase the value of at least one of the frequency division data stored in the memory when the frequency of the constant frequency signal is higher than the desired request frequency, even if the frequency precision of the oscillating circuit is low, the clock signal of a desired frequency which satisfies the request precision can be generated.

BRIEF DESCRIPTION OF THE DRAWINGS

FIG. 5 is a diagram showing an example of storage contents in the memory 35 rewritten by the fine adjustment of a clock frequency in the case where a frequency of a clock signal CLK is lower than a request frequency $f_p$;

FIG. 6 is a diagram showing an example of storage contents in the memory 35 rewritten by the fine adjustment of a clock frequency in the case where the frequency of the clock signal CLK is higher than the request frequency $f_p$;

FIG. 7 is a time chart showing the internal operation of a frequency dividing circuit 3 in the case where the frequency of the clock signal CLK coincides with the request frequency $f_p$;

FIG. 8 is a time chart showing the internal operation of a frequency dividing circuit 3 in the case where the frequency of the clock signal CLK is lower than the request frequency $f_p$;

FIG. 11 is a diagram showing a time adjustment subroutine which is executed by a CPU 105 of the terminal apparatus 400 shown in FIG. 10.

DETAILED DESCRIPTION OF THE PREFERRED EMBODIMENTS

Figure 1:
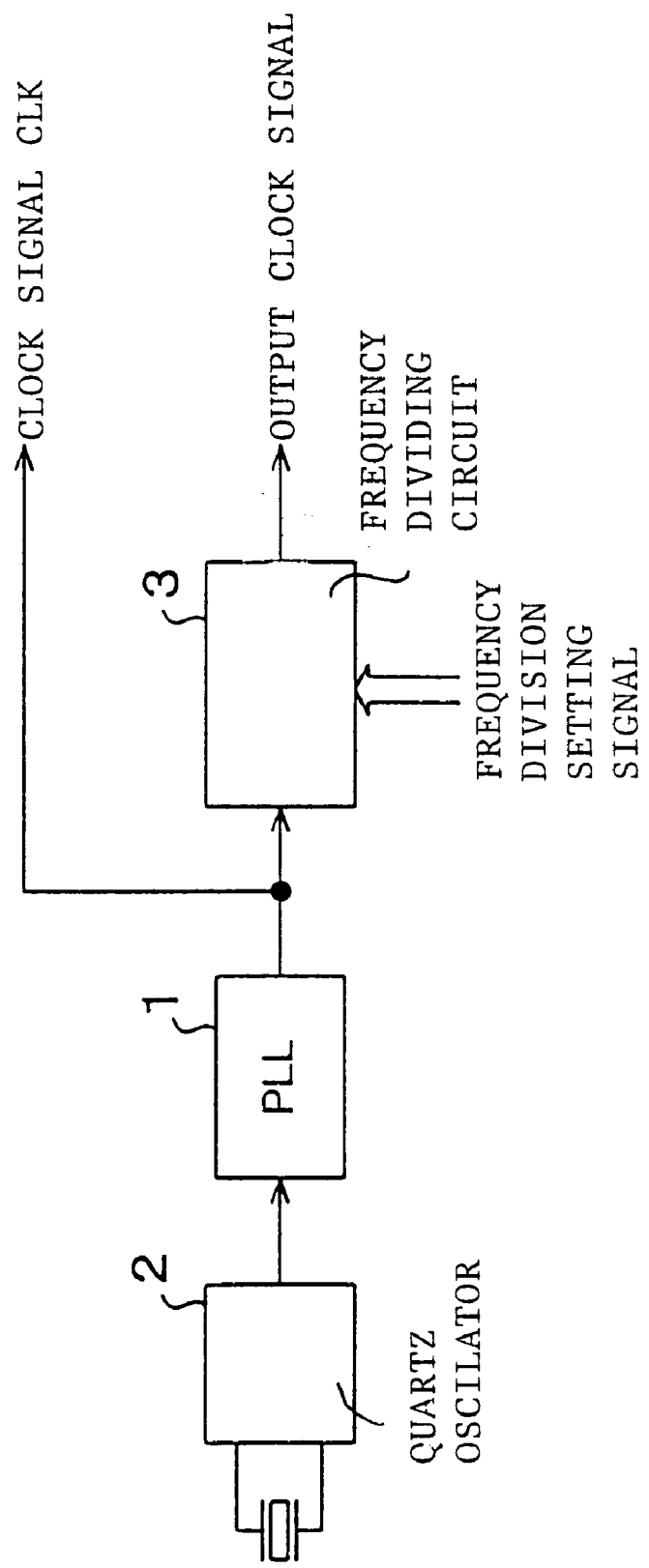
FIG. 1 is a diagram showing the structure of a clock signal generating circuit according to the invention.

FIG. 1 is a diagram showing a construction of a clock signal generating circuit according to the invention.

In FIG. 1, a PLL (phase locked loop) circuit 1 forms a clock signal CLK of a frequency obtained by multiplying a frequency of a constant frequency signal having a predetermined frequency generated by a quartz oscillator 2 as an oscillating circuit and generates it.

A frequency dividing circuit 3 generates a clock signal, as an output clock signal, obtained by dividing the frequency of the clock signal CLK by 1/N. The frequency dividing circuit 3 can finely adjust the frequency of the output clock signal to be generated in accordance with various frequency division setting signals, which will be explained later.

Figure 2:
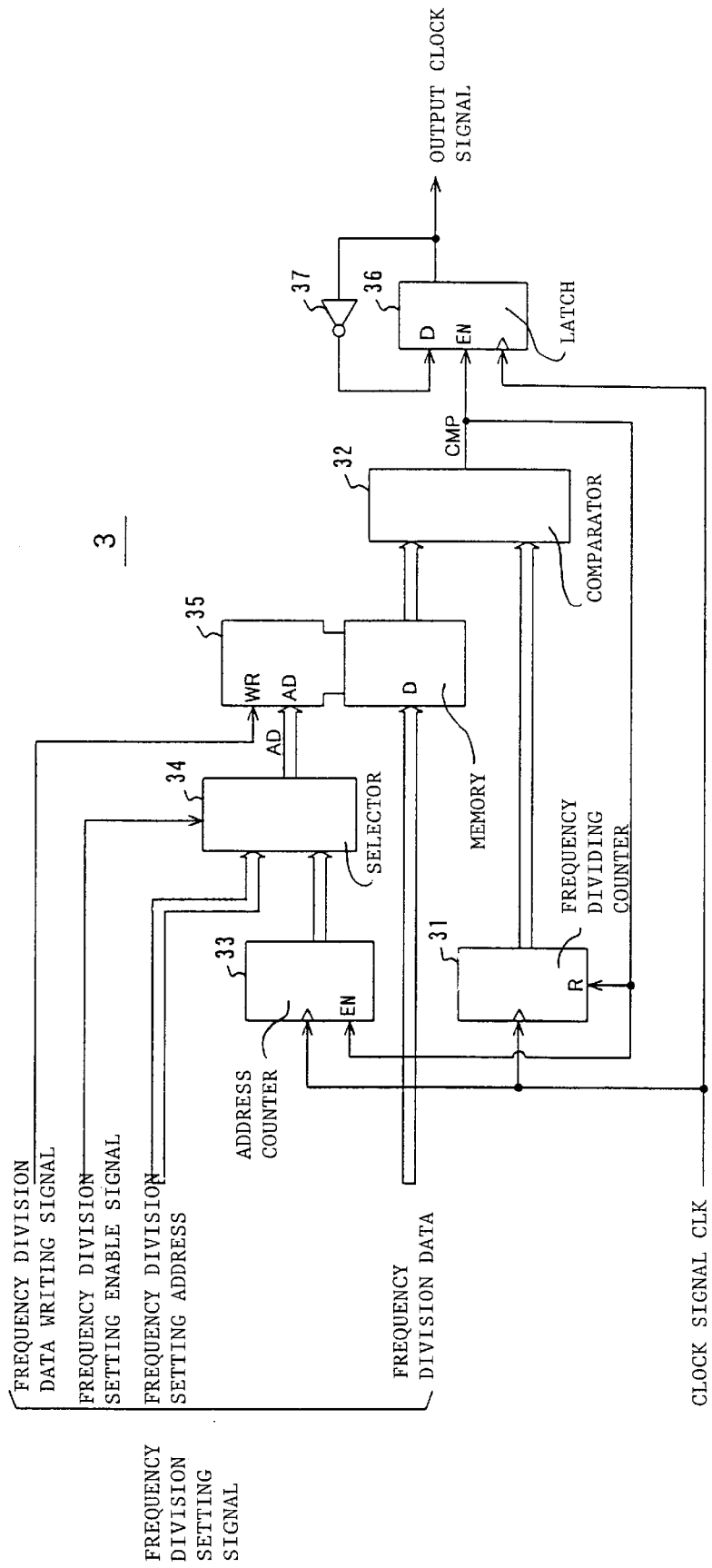
FIG. 2 is a diagram showing an internal construction of a frequency dividing circuit 3 in the clock signal generating circuit according to the invention.

FIG. 2 is a diagram showing an internal construction of the frequency dividing circuit 3.

In FIG. 2, a frequency dividing counter 31 supplies a count value obtained by counting the number of pulses of the clock signal CLK to a comparator 32. When a comparison result signal CMP at, for example, a logic level "1" indicative of the coincidence of the comparison is supplied from the comparator 32, the frequency dividing counter 31 resets the count value to "0" in response to an edge timing of the clock signal CLK. An address counter 33 counts up the count value by "1" each time the comparison result signal CMP at the logic level "1" indicative of the comparison coincidence is supplied from the comparator 32. When the count value reaches "n–1", the address counter 33 resets the count value to the initial value, for example, "0" by the next count-up operation and continues the counting operation again from this point. When a frequency division setting enable signal at the logic level "0" is supplied, a selector 34 supplies the count value of the address counter 33 as a memory address AD to a memory 35. When the frequency division setting enable signal at the logic level "1" is supplied, the selector 34 supplies a frequency division setting address supplied from the outside as a memory address AD to the memory 35. In response to a frequency division data writing signal, the memory 35 writes the frequency division data into an address shown by the memory address AD. Further, the memory 35 reads out the frequency division data stored in the address shown by the memory address AD and supplies it to the comparator 32. The memory 35 is a non-volatile memory whose storage contents are held even when a power source is turned off. The comparator 32 compares the frequency division data read out from the memory 35 with the count value of the frequency dividing counter 31, generates the comparison result signal CMP at the logic level "1" when they coincide and at the logic level "0" when they do not coincide, and supplies it to each of the frequency dividing counter 31, the address counter 33, and an enable latch 36. The enable latch 36 and an inverter 37 form a signal whose logic level is inverted at an edge timing of the clock signal CLK each time the comparison result signal CMP at the logic level "1" is supplied and generate it as an output clock signal.

In the clock signal generating circuit shown in FIGS. 1 and 2, to generate an output clock signal of a desired frequency, a clock frequency dividing number in the frequency dividing circuit 3 has previously initially been set to an arbitrary number.

Figures 3, 4:
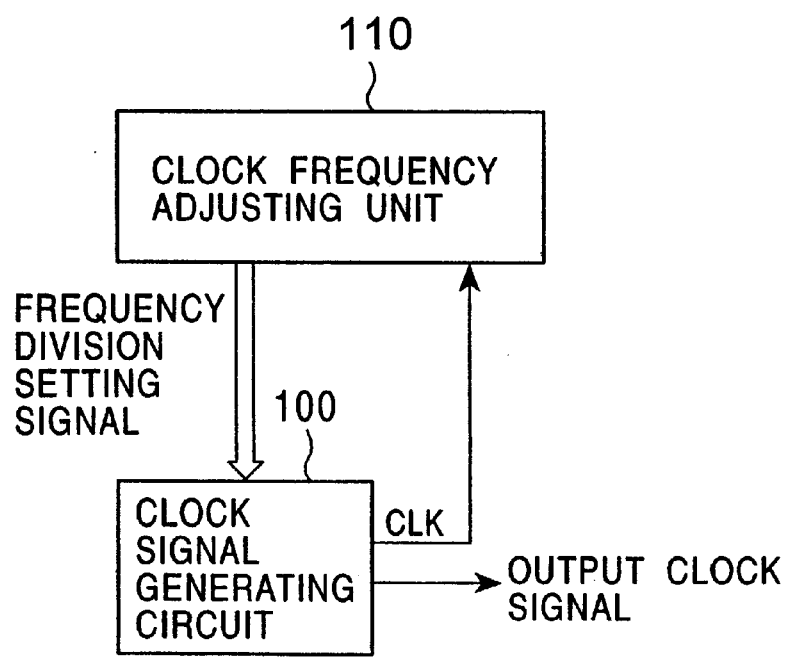
FIG. 3 is a diagram showing an example of frequency division data written in a memory 35 of the frequency dividing circuit 3 by an initial setting.
FIG. 4 is a diagram showing an example of a system construction when a fine adjustment is performed to a clock signal generating circuit 100 according to the invention.

For example, when the user wants to generate the output clock signal of a frequency that is ⅙ of a request frequency $f_p$ requested as a clock signal CLK, namely, a frequency of $(⅙) \cdot f_p$, as shown in FIG. 3, "2" is written as frequency division data to decide the clock frequency dividing number "6" into each of addresses 0 to 3 in the memory 35.

When the initial setting is finished, a fine adjustment of the clock frequency is performed to the clock signal generating circuit. The fine adjustment is executed, for example, in an inspecting and adjusting step at the time of shipment from a factory.

FIG. 4 is a diagram showing an example of a system construction when the fine adjustment is performed.

As shown in FIG. 4, a clock frequency adjusting unit 110 to adjust the clock frequency in accordance with a clock frequency adjusting method according to the invention is connected to a clock signal generating circuit 100 having an internal construction as shown in FIGS. 1 and 2.

First, the clock frequency adjusting unit 110 supplies the frequency division setting enable signal at the logic level "1" to the clock signal generating circuit 100. The selector 34 of the clock signal generating circuit 100, therefore, supplies the frequency division setting address supplied from the clock frequency adjusting unit 110 as a memory address AD to the memory 35.

The clock frequency adjusting unit 110 subsequently fetches the clock signal CLK generated from the PLL circuit 1 of the clock signal generating circuit 100 and measures its frequency.

When the measured frequency of the clock signal CLK almost coincides with the request frequency $f_p$, since there is no need to adjust the frequency, the clock frequency adjusting unit 110 finishes the operation.

When the measured frequency of the clock signal CLK is lower than the request frequency $f_p$, for example, when it is equal to 11/12 of the request frequency $f_p$, the clock frequency adjusting unit 110 supplies the frequency division data, frequency division setting address, and frequency division data writing signal to the frequency dividing circuit 3 in order to rewrite only the frequency division data stored in address 3 in the memory 35 to "1" as shown in FIG. 5. That is, the value of the frequency division data stored in the memory 35 is decreased from "2" to "1".

When the measured frequency of the clock signal CLK is higher than the request frequency $f_p$, for example, when it is equal to 13/12 of the request frequency $f_p$, the clock frequency adjusting unit 110 supplies the frequency division data, frequency division setting address, and frequency division data writing signal to the frequency dividing circuit 3 in order to rewrite only the frequency division data stored in address 3 in the memory 35 to "3" as shown in FIG. 6. That is, the value of the frequency division data stored in the memory 35 is increased from "2" to "3".

When the fine adjustment of the clock frequency as mentioned above is finished, the clock frequency adjusting unit 110 is made inoperative and the frequency division setting enable signal at the logic level "0" is fixedly supplied to the selector 34 of the frequency dividing circuit 3. That is, the selector 34 supplies the count value of the address counter 33 as a memory address AD to the memory 35.

The operation of the clock signal generating circuit whose clock frequency has been finely adjusted will now be described hereinbelow. It is assumed that the address counter 33 is a quaternary counter performing a counting process in which the count value circulates in a range of "0" to "3".

FIG. 7 is a diagram showing an internal operation timing of the frequency dividing circuit 3 in the case where the frequency of the clock signal CLK generated by the quartz oscillator 2 and PLL circuit 1 almost coincides with the request frequency $f_p$.

When the frequency of the clock signal CLK almost coincides with the request frequency $f_p$, since the frequency division data has been written in the memory 35 in a form shown in FIG. 3, the frequency division data which is read out from the memory 35 is always equal to "2" as shown in FIG. 7. The comparator 32, therefore, generates the comparison result signal CMP whose logic level is changed from "0" to "1" each time the count value of the frequency dividing counter 31 reaches "2" as shown in FIG. 7. The enable latch 36, therefore, generates an output clock signal in which a length of two periods is equal to 12 pulses of the clock signal CLK, namely, a length of one period is equal to 6 pulses of the clock signal CLK as shown in FIG. 7.

As mentioned above, when the frequency of the clock signal CLK almost coincides with the request frequency $f_p$, by frequency dividing the clock signal CLK into ⅙ as it is, the output clock signal of the frequency of $(⅙) \cdot f_p$ can be generated.

FIG. 8 is a diagram showing an internal operation timing of the frequency dividing circuit 3 when the frequency of the clock signal CLK is equal to 11/12 of the request frequency $f_p$, namely, when it is equal to $(f_p \cdot (11/12))$.

Since the frequency division data has been written in the memory 35 in a form shown in FIG. 5, the frequency division data that is read out from the memory 35 is equal to "2" when the count value (memory address AD) of the address counter 33 lies within a range of "0" to "2" and is equal to "1" when the count value is equal to "3" as shown in FIG. 8. For a period of time during which the frequency division data that is read out from the memory 35 is equal to "2", therefore, the comparator 32 generates the comparison result signal CMP whose logic level is changed from "0" to "1" each time the count value of the frequency dividing counter 31 reaches "2". For a period of time during which the frequency division data that is read out from the memory 35 is equal to "1", however, the logic level of the comparison result signal CMP is changed from "0" to "1" at a point when the count value of the frequency dividing counter 31 reaches "1" as shown in FIG. 8. The enable latch 36, therefore, generates an output clock signal in which a length of two periods corresponds to 11 pulses of the clock signal CLK as shown in FIG. 8. Since the frequency of the clock signal CLK is equal to a frequency ($f_p \cdot (11/12)$) lower than the request frequency $f_p$, an average length $T_A$ of one period of the output clock signal is equal to $$T_A = \{1/(f_p \cdot (11/12))\} \cdot (11/2) = 1/(f_p \cdot (\tfrac{1}{6}))$$

and its frequency is equal to $(\tfrac{1}{6}) \cdot f_p$.

Even if the frequency of the clock signal CLK is equal to the frequency ($f_p (11/12)$) lower than the request frequency $f_p$, the output clock signal having a frequency of $(\tfrac{1}{6}) \cdot f_p$ can be obtained.

Figure 9:
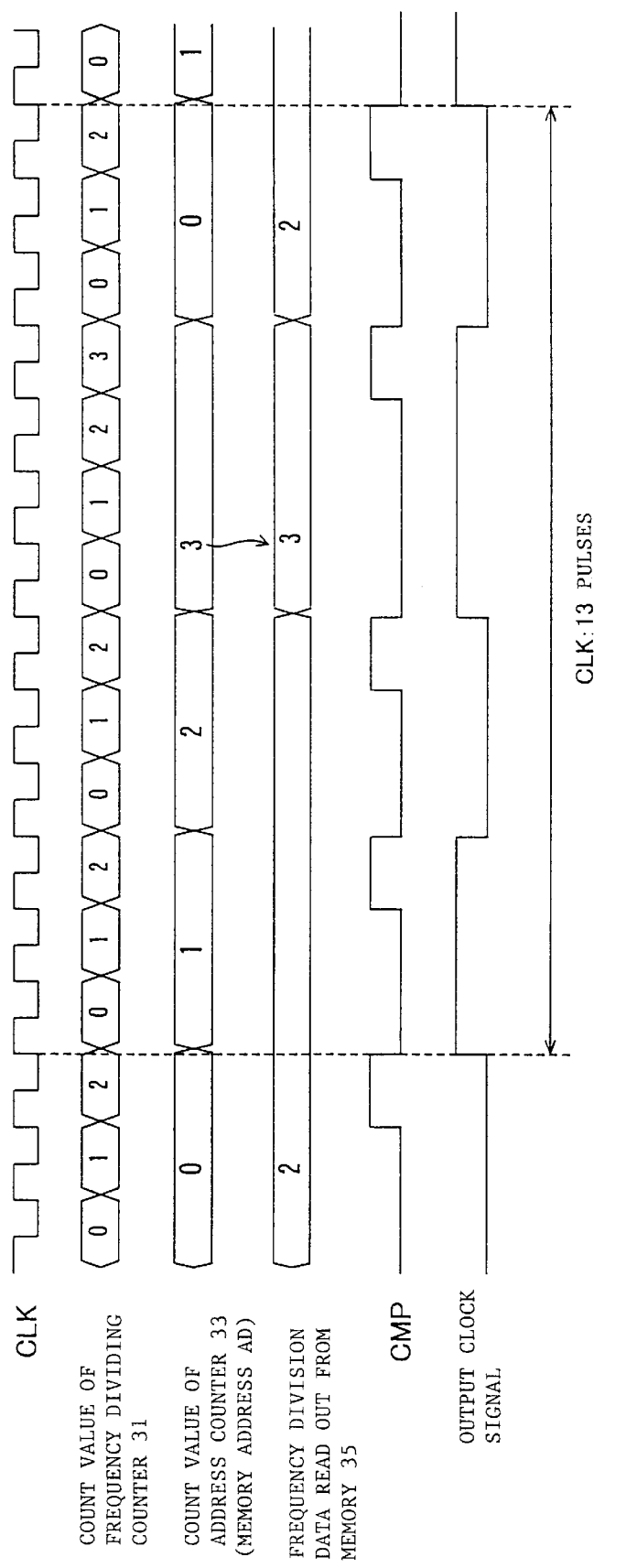
FIG. 9 is a time chart showing the internal operation of a frequency dividing circuit 3 in the case where the frequency of the clock signal CLK is higher than the request frequency $f_p$.

FIG. 9 is a diagram showing an internal operation timing of the frequency dividing circuit 3 when the frequency of the clock signal CLK is equal to 13/12 of the request frequency $f_p$, namely, when it is equal to ($f_p \cdot (13/12)$).

Since the frequency division data has been written in the memory 35 in a form shown in FIG. 6, the frequency division data that is read out from the memory 35 is equal to "2" when the count value (memory address AD) of the address counter 33 lies within a range of "0" to "2" and is equal to "3" when the count value is equal to "3" as shown in FIG. 9. For a period of time during which the frequency division data that is read out from the memory 35 is equal to "2", the comparator 32 generates the comparison result signal CMP whose logic level is changed from "0" to "1" each time the count value of the frequency dividing counter 31 reaches "2" as shown in FIG. 9. For a period of time during which the frequency division data that is read out from the memory 35 is equal to "3", however, the logic level of the comparison result signal CMP is not changed from "0" to "1" until the count value of the frequency dividing counter 31 reaches "3" as shown in FIG. 9. The enable latch 36, therefore, generates an output clock signal in which a length of two periods corresponds to 13 pulses of the clock signal CLK as shown in FIG. 9. Since the frequency of the clock signal CLK is equal to a frequency ($f_p \cdot (13/12)$) higher than the request frequency $f_p$, an average length $T_A$ of one period of the output clock signal is equal to $$T_A = \{1/(f_p \cdot (13/12))\} \cdot (13/2) = 1/(f_p \cdot (\tfrac{1}{6}))$$

and its frequency is equal to $(\tfrac{1}{6}) \cdot f_p$.

Even if the frequency of the clock signal CLK is equal to the frequency ($f_p \cdot (13/12)$) higher than the request frequency $f_p$ the output clock signal having a frequency of $(\tfrac{1}{6}) \cdot f_p$ can be obtained.

As mentioned above, according to the invention, even if the frequency of the constant frequency signal which is generated by the oscillating circuit is deviated from the request frequency because the precision of the oscillating circuit is low, the clock signal of the desired frequency can be generated on the basis of the constant frequency signal.

Although the quaternary counter is used as an address counter 33 and the frequency division data is stored in addresses 0 to 3 in the memory 35 in the embodiment, the invention is not limited to the construction. In brief, it is sufficient to store the frequency division data into each of addresses 0 to (n−1) in the memory 35 by using the address counter. By properly setting the number of addresses in the memory 35 which is prepared to store the frequency division data and the frequency division data to be stored in each address, the clock signals of various frequencies can be generated on the basis of the constant frequency signal generated by the oscillating circuit irrespective of the frequency precision of the oscillating circuit.

Although only the frequency division data stored in address 3 in the memory 35 is increased or decreased in the embodiment, values of a plurality of frequency division data can be increased or decreased in accordance with the precision of the clock signal CLK. In brief, it is sufficient to decrease the value of at least one of the frequency division data stored in the memory 35 when the frequency of the clock signal CLK is lower than the desired request frequency $f_p$ and to increase the value of at least one of the frequency division data stored in the memory 35 when the frequency of the clock signal CLK is higher than the desired request frequency $f_p$.

Although the fine adjustment of the clock frequency is executed only in the inspecting· adjusting step at the time of shipment from a factory in the embodiment, it can be periodically executed in the ordinary operation.

Figure 10:
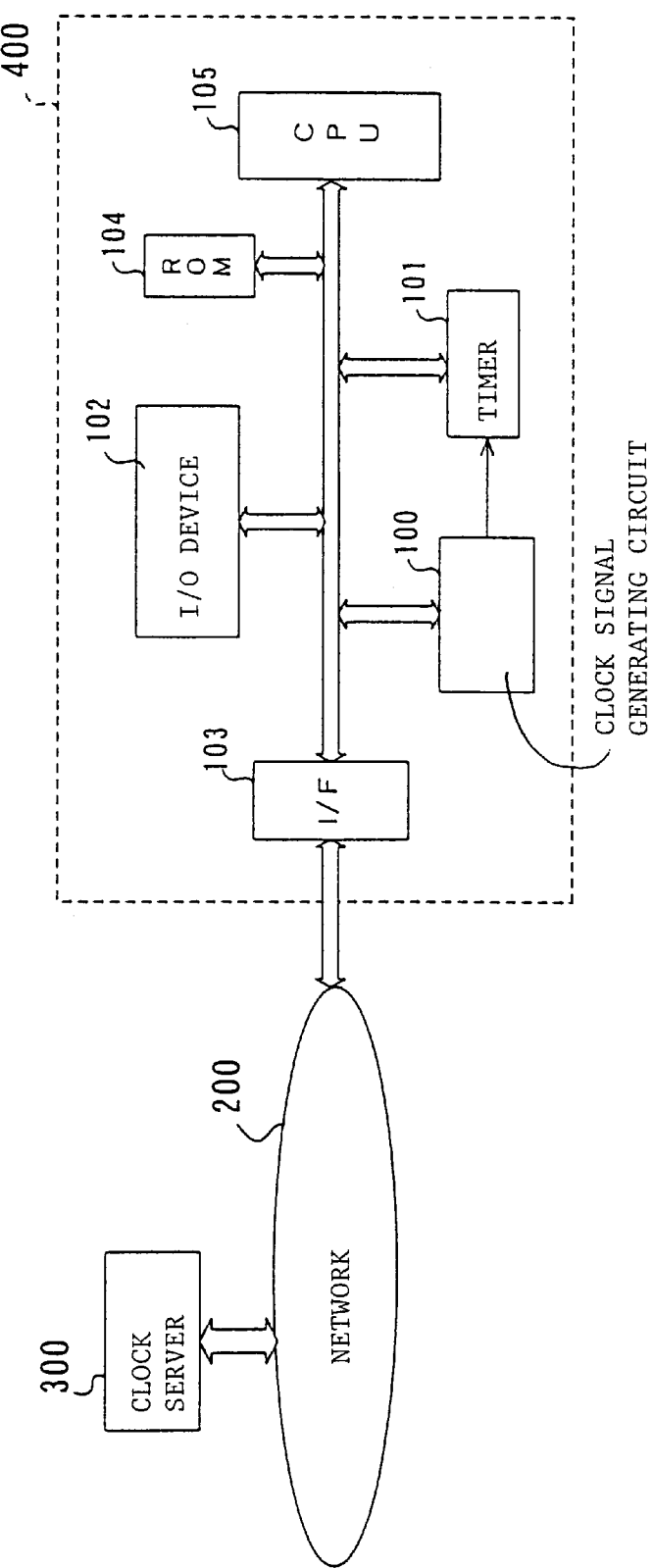
FIG. 10 is a diagram showing a construction of a network system including a terminal apparatus 400 having the clock signal generating circuit 100 according to the invention.

FIG. 10 is a diagram showing a construction of a network system made in consideration of the above point.

In FIG. 10, a clock server 300 to provide standard time and a terminal apparatus 400 in which the clock signal generating circuit 100 having the internal construction shown in FIGS. 1 and 2 is mounted are connected to a network 200 comprising the Internet, LAN (local area network), or the like.

The terminal apparatus 400 has: a timer circuit 101 to measure the time on the basis of the output clock signal generated from the clock signal generating circuit 100; an input/output (I/O) device 102 for allowing various terminal functions to be executed; and an interface circuit 103 to establish a bidirectional communication with the network 200. Further, the terminal apparatus 400 has a CPU 105 to control each of the clock signal generating circuit 100, timer circuit 101, I/O device 102, and connection interface circuit 103 in accordance with software stored in an ROM 104.

The terminal apparatus 400 executes various information management by using the time measured by the timer circuit 101 as absolute time. The extent of "delay" or "advancement" of the time measurement of the timer circuit 101 itself is periodically and finely adjusted in the terminal apparatus 400.

FIG. 11 is a diagram showing a time adjustment subroutine which is executed by the CPU 105 in accordance with the software stored in the ROM 104 in order to perform the fine adjustment.

In FIG. 11, the CPU 105 first receives the standard time provided from the clock server 300 by accessing the network 200 and stores it into a built-in register X (not shown) (step S2). The CPU 105 discriminates whether the times respectively stored in the built-in registers X and Y coincide or not (step S3). When it is determined in step S3 that they are not identical, the CPU 105 reads out the frequency division data stored in, for example, address 3 in the memory 35 and stores it into a built-in register Z (not shown) (step S4). The CPU 105 discriminates whether the time stored in the built-in register X is longer than the time stored in the built-in register Y or not (step S5). That is, in step S5, whether the time measured by the timer circuit 101 is delayed relative to the standard time provided from the clock server 300, or not, is discriminated.

When it is determined in step S5 that the time stored in the built-in register X is longer, namely, when it is decided that the time measured by the timer circuit 101 is delayed than the standard time provided from the clock server 300, the CPU 105 overwrites a value obtained by subtracting "1" from the value of the frequency division data stored in the built-in register Z into the built-in register Z (step S6).

When it is determined in step S5 that the time stored in the built-in register X is shorter, namely, when it is decided that the time measured by the timer circuit 101 is advanced than the standard time provided from the clock server 300, the CPU 105 overwrites a value obtained by adding "1" to the value of the frequency division data stored in the built-in register Z into the built-in register z (step S7).

After execution of step S6 or S7, the CPU 105 overwrites the contents stored in the built-in register Z as new frequency division data into the address in the memory 35 from which the reading operation has been performed in step S4 (for example, address 3 in the memory 35) (step S8).

In the case where the time measured by the timer circuit 101 is advanced from the standard time, as mentioned above, the value of the frequency division data stored in the memory 35 is increased by the execution of steps S7 and S8. The frequency of the output clock signal which is generated by the clock signal generating circuit 100, therefore, becomes low, so that the "time advance" in the timer circuit 101 is corrected.

In the case where the time measured by the timer circuit 101 is delayed from the standard time, as mentioned above, the value of the frequency division data stored in the memory 35 is decreased by the execution of steps S6 and S8. The frequency of the output clock signal which is generated by the clock signal generating circuit 100, therefore, becomes high, so that the "time delay" in the timer circuit 101 is corrected.

After execution of step S8, or when it is determined in step S3 that the time stored in the built-in register X and the time stored in the built-in register Y coincide, the CPU 105 exits the time adjustment subroutine and returns to the execution of a main flow to control the main operation of the terminal apparatus.

The time adjustment subroutine shown in FIG. 11 is periodically executed every elapse of a predetermined time during the execution of the main flow.

Even if the frequency precision of the oscillating circuit (quartz oscillator 2) mounted in the clock signal generating circuit 100 is low, the frequency precision of the output clock signal which is generated from the clock signal generating circuit 100 becomes high, so that the time measurement is accurately performed by the timer circuit 101.

Although the non-volatile memory is used as a memory 35 of the frequency dividing circuit 3 in the embodiment, it is not always necessary to use the non-volatile memory in dependence on an apparatus in which the clock signal generating circuit according to the invention is mounted. In brief, so long as the clock signal generating circuit is mounted in an apparatus such that the initial setting as shown in FIG. 3 and the fine adjustment as shown in FIG. 5 or 6 is executed each time the power source is turned on, a register or the like can be substituted for the memory 35.

As described in detail above, according to the invention, there is provided the clock signal generating circuit for generating a clock signal of a frequency obtained by dividing a frequency of a constant frequency signal, comprising: the memory in which a plurality of frequency division data has been stored; the memory control circuit for controlling so as to sequentially and repetitively read out each of the frequency division data stored in the memory; the frequency dividing counter for obtaining a count value by counting the number of pulses of the constant frequency signal and resetting the count value to an initial value when the count value coincides with the frequency division data read out from the memory; and the circuit for generating a signal, as a clock signal, whose logic level is inverted each time the frequency division data read out from the memory and the count value coincide.

By performing the adjustment, therefore, in a manner such that the value of at least one of the frequency division data stored in the memory is decreased when the frequency of the constant frequency signal is lower than the desired request frequency and the value of at least one of the frequency division data stored in the memory is increased when the frequency of the constant frequency signal is higher than the desired request frequency, even if the oscillating circuit of low frequency precision is used as an oscillating circuit to generate the constant frequency signal, the clock signal of a desired frequency which satisfies the request precision can be generated.

According to the invention, therefore, since a cheap oscillating circuit of relatively low precision can be used as an oscillating circuit as a clock generating source, a low price of the product can be realized.

What is claimed is:

1. A clock signal generating circuit for generating a clock signal of a frequency lower than a constant signal frequency of a constant frequency signal, obtained by division of the constant signal frequency, comprising:

a memory in which a plurality of frequency division data has been stored, the plurality of frequency division data representing an amount of the division of the frequency of the constant frequency signal;

a memory control circuit for controlling sequential and repetitive read out of each of said frequency division data stored in said memory;

a frequency dividing counter for obtaining a count value by counting the number of pulses of said constant frequency signal and resetting said count value to an initial value when said count value coincides with said frequency division data read out from said memory; and a circuit for forming a signal whose logic level is inverted each time said frequency division data read out from said memory and said count value coincide, and generating it as said clock signal.

2. A circuit according to claim 1, wherein said memory control circuit changes said frequency division data to be read out from said memory when said frequency division data read out from said memory and said count value coincide.

3. A method of adjusting a clock frequency of a clock signal generating circuit, the generating circuit including an oscillating circuit for generating a constant frequency signal, which is oscillated at a predetermined frequency, a memory in which a plurality of frequency division data has been stored, the plurality of frequency division data representing an amount of the division of the predetermined frequency; a memory control circuit for controlling sequential and repetitive read out of each of said frequency division data stored in said memory, a frequency dividing counter for obtaining a count value by counting the number of pulses of said constant frequency signal and resetting said count value to an initial value when said count value coincides with said frequency division data read out from said memory, and a circuit for generating a signal, as a clock signal, whose logic level is inverted each time said frequency division data read out from said memory sand said count value coincide, comprising the steps of decreasing a value of at least one of said frequency division data stored in said memory when a frequency of said constant frequency signal is lower than a desired request frequency; and increasing a value of at least one of said frequency division data stored in said memory when the frequency of said constant frequency signal is higher than said desired request frequency.

4. A method according to claim 3, further comprising the step of changing the frequency division data to be read out from the memory when the frequency division data read out from the memory and the count value coincide.

5. A method according to claim 3, further comprising the step of changing with the memory control circuit the frequency division data to be read out from the memory when the frequency division data read out from the memory and the count value coincide.

6. A method of adjusting a clock frequency of a clock signal generating circuit, the generating circuit including an oscillating circuit for generating a constant frequency signal, which is oscillated at a predetermined frequency, comprising the steps of storing a plurality of frequency division data in a memory, the plurality of frequency division data representing an amount of the division of the predetermined frequency;

controlling sequential and repetitive read out of each of the frequency division data stored in the memory, obtaining a count value by counting the number of pulses of the constant frequency signal and resetting the count value to an initial value when the count value coincides with the frequency division data read out from the memory, and generating a signal, as a clock signal, whose logic level is inverted each time the frequency division data read out from the memory and the count value coincide, decreasing a value of at least one of said frequency division data stored in said memory when a frequency of said constant frequency signal is lower than a desired request frequency; and increasing a value of at least one of said frequency division data stored in said memory when the frequency of said constant frequency signal is higher than said desired request frequency.

7. A method according to claim 6, further comprising the step of changing the frequency division data to be read out from the memory when the frequency division data read out from the memory and the count value coincide.

8. A method according to claim 6, further comprising the step of changing with the memory control circuit the frequency division data to be read out from the memory when the frequency division data read out from the memory and the count value coincide.

\* \* \* \* \*